(12) United States Patent
Inoue et al.

(10) Patent No.: US 6,917,075 B2
(45) Date of Patent: Jul. 12, 2005

(54) SEMICONDUCTOR DEVICE

(75) Inventors: Akira Inoue, Kadoma (JP); Akira Asai, Osaka (JP); Teruhito Ohnishi, Hirakata (JP); Haruyuki Sorada, Hirakata (JP); Yoshihiro Hara, Hirakata (JP); Takeshi Takagi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/752,409

(22) Filed: Jan. 7, 2004

(65) Prior Publication Data

US 2004/0142522 A1 Jul. 22, 2004

Related U.S. Application Data

(63) Continuation of application No. PCT/JP03/06173, filed on May 19, 2003.

(30) Foreign Application Priority Data

May 17, 2002 (JP) .................................. 2002-142637

(51) Int. Cl.$^7$ .......................... H01L 29/76; H01L 29/94; H01L 31/062; H01L 31/113; H01L 31/119
(52) U.S. Cl. ..................................... 257/331; 257/503
(58) Field of Search ................................ 257/331, 332, 257/333, 335, 374, 499, 503

(56) References Cited

U.S. PATENT DOCUMENTS

| | | | |
|---|---|---|---|
| 5,559,368 A | | 9/1996 | Hu et al. |
| 5,814,867 A | * | 9/1998 | Saito .......................... 257/379 |
| 6,355,492 B1 | * | 3/2002 | Tanaka et al. ................. 438/3 |
| 6,534,840 B2 | * | 3/2003 | Esaki .......................... 257/499 |
| 6,753,555 B2 | * | 6/2004 | Takagi et al. ................ 257/192 |

OTHER PUBLICATIONS

Fariborz Assaderaghi, et al., "A Dynamic Threshold Voltage Mosfet (DTMOS) for Very Low Voltage Operation", 1994 IEEE, pp. 510–512.

* cited by examiner

Primary Examiner—Phuc T. Dang
(74) Attorney, Agent, or Firm—McDermott Will & Emery LLP

(57) ABSTRACT

A semiconductor device and a method of fabricating the same according to this invention are such that: a gate insulator is formed over a predetermined region of a semiconductor substrate; a gate electrode is formed on the gate insulator; source and drain regions respectively formed in portions of the predetermined region that are situated on both sides of the gate electrode in plan view; a body region formed by a region of the predetermined region exclusive of the source and drain regions; and a contact electrically interconnecting the gate electrode and the body region, wherein a portion of the contact which is connected to the gate electrode is formed to intersect the gate electrode in plan view.

11 Claims, 22 Drawing Sheets

US 6,917,075 B2

SEMICONDUCTOR DEVICE

This is a continuation application under 35 U.S.C 111(a) of pending prior International Application No. PCT/JP03/06173, filed on May 19, 2003.

BACKGROUND OF THE INVENTION

1. Field of the Invention

The present invention relates to a semiconductor device which operates at a low source voltage by dynamically varying its threshold voltage.

2. Description of the Related Art

In these years, wide use is being made of personal digital assistant devices, a representative of which is a mobile telephone. Since such a mobile device is generally driven with a battery, a device of lower power consumption is strongly desired.

In order to realize lower power consumption without sacrificing a high-speed operation it is necessary to maintain the driving power by increasing the drain saturation current as well as to lower the source voltage by lowering the threshold voltage.

As a device solving such a problem, there has been proposed a DTMOS (Dynamic Threshold Voltage MOSFET) which exhibits reduced leakage current while having a high driving ability even at a low voltage (see F. Assaderaghi et. al.,) "A Dynamic Threshold Voltage MOS-FET (DTMOS) for Very Low Voltage Operation P. 510–512". The DTMOS has the characteristic that the gate electrode and the body region are electrically connected to each other. When a voltage is applied to the gate in a state thus short-circuited with the body, a forward bias voltage having a magnitude equal to that of the gate voltage is applied to the substrate active region. Thus, the DTMOS assumes the same state as an ordinary transistor when the gate is off, whereas when the gate is on, the threshold lowers because the substrate is increasingly biased forwardly with increasing voltage applied to the gate. This effect causes an effective applied gate voltage to increase, which produces a gate overdrive effect thereby realizing high driving power.

A problem arising in the fabrication of such a DTMOS is involved in methods of interconnecting the gate electrode and the body region.

FIG. 17 is a plan view schematically illustrating a connecting structure between the gate electrode and the body region in a conventional DTMOS; FIG. 18 is a sectional view taken along line XVIII—XVIII of FIG. 17; FIG. 19 is a sectional view taken along line XIX—XIX of FIG. 17; and FIG. 20 is a sectional view taken along line XX—XX of FIG. 17.

In the DTMOS (of n-channel type) shown in FIGS. 17 to 20, a gate insulator 3 is formed over a device active region 110 of a semiconductor substrate (hereinafter referred to as "substrate") 1 and a gate electrode G is formed on the gate insulator 3. Source/drain regions 2 of n-type are formed in respective of regions situated directly under the surface of the substrate 1 on both sides of the gate electrode G in plan view. An interlayer dielectric 5 is formed to cover the gate electrode G and the gate insulator 3. The substrate 1 is doped into p-type. A high p-type impurity concentration region (hereinafter referred to as "$p^+$ region") 4 is formed in a region situated directly under the surface of the substrate 1 and beneath a widthwise end of the gate electrode G in plan view. A first contact hole H1 is formed to extend through the gate insulator 3 and the interlayer dielectric 5 so as to interconnect the $p^+$ region and the widthwise end of the gate electrode G. The first contact hole H1 is filled up with an electric conductor to form a first contact C1. Thus, the gate electrode G is electrically connected to a region 103 of the device active region 110 exclusive of the source/drain regions 2,2. (Accordingly, the region 103 includes the $p^+$ region. The region 103 will hereinafter be referred to as "body region".) Reference characters H2 and C2 denote a second contact hole and a second contact, respectively, which interconnect the source/drain regions 2 and non-illustrated aluminum wire. In the present specification the direction along the channel length (the direction along the length of the gate electrode) is referred to as "X direction" while the direction along the channel width (the direction along the width of the gate electrode) referred to as "Y direction".

This structure has the characteristic that it is possible to implement the structure without changing the process and, in addition, to suppress an increase in the device area because the structure has the sole first contact C1.

However, the connecting structure between the gate electrode G and the body region 103 utilizing the sole single first contact C1 involves a problem that variation in contact resistance occurs since the contact area varies because of positional deviation and dimensional deviation between the gate electrode G and the first contact C1.

The contact resistance is a very important parameter determining a CR delay component in analog circuits. Variation in contact resistance not only results in variation in device characteristics but also cause interference with circuit designing. For this reason, such variation in contact resistance need be reduced to the limit.

FIGS. 21A and 21B and FIGS. 22A and 22B are plan views illustrating positional relations between the gate electrode and the first contact in the conventional DTMOS; specifically, FIGS. 21A and 21B illustrate the cases where the position of the first contact deviates in the X direction, while FIGS. 22A and 22B illustrate the cases where the position of the first contact deviates in the Y direction.

As shown in FIGS. 17 and 20, the first contact hole H1 is formed to extend over the gate electrode G and the $p^+$ region 4 in plan view. In FIG. 20 reference character 51 depicts a contact portion between the first contact C1 and the gate electrode G and reference character 52 depicts a contact portion between the first contact C1 and the $p^+$ region 4 (hence the body region 103). As apparent from FIGS. 21A and 21B, when the first contact C1 deviates in the X direction, the area of the contact portions of the first contact C1 in contact with the gate electrode G and the body region 103 (hereinafter referred to as "contact area") does not vary. However, as apparent from FIG. 22A, when the first contact C1 deviates toward a direction away from the center of the gate electrode G in the Y direction (hereinafter referred to as "+Y direction), the contact area A1 between the first contact C1 and the body region 103 increases, whereas the contact area A2 between the first contact C1 and the gate electrode G decreases. Accordingly, when the first contact C1 deviates toward the +Y direction, the contact resistance of the first contact C1 to the body region 103 decreases, while, to the contrary, the contact resistance of the first contact C1 to the gate electrode G increases. On the other hand, when the first contact C1 deviates toward a direction toward the center of the gate electrode G (hereinafter referred to as "−Y direction"), the contact area A1 between the first contact C1 and the body region 103 decreases, whereas the contact area A2 between the first contact C1 and the gate electrode G increases. Accordingly, when the first contact C1 deviates in the −Y direction, the contact resistance of the first contact C1 to the body region 103 increases, while, to the contrary, the contact resistance of the first contact C1 to the gate electrode G decreases. In this way, in the conventional structure the contact resistance varies with positional deviation of the first contact C1 in the Y direction.

However, the occurrence of such positional deviation and dimensional variation of the first contact C1 during substrate processing is an essential problem, which necessarily arises in the fabrication of semiconductor devices. This problem is unavoidable. Such positional deviation and dimensional variation occur due mainly to a lithography process for transferring a pattern to a semiconductor substrate. Since positional deviation and dimensional variation due to the lithography process depend upon the performance of a lithography apparatus used and the environment where the lithography apparatus is used, they constitute an unavoidable problem. In fabrication plants strict control is made over positional deviation and dimensional variation in the lithography process. Taking specific values for instance, with a lithography apparatus using i-line as a light source, control is made so as to suppress the amount of positional deviation to about ±0.15 μm and the amount of dimensional variation to about 20% of a minimum size; with a lithography apparatus using KrF as a light source, control is made so as to suppress the amount of positional deviation to about ±0.10 μm and the amount of dimensional variation to about 10% of a minimum size.

SUMMARY OF THE INVENTION

It is an object of the present invention to provide a semiconductor device and a method of fabricating the same, which are capable of reducing variation in contact resistance due to positional deviation and dimensional variation of the contact interconnecting the gate electrode and the body region.

With a view to attaining this object, the present invention provides a semiconductor device and a method of fabricating the same, which are such that: forming a gate insulator over a predetermined region of a semiconductor substrate; a gate electrode is formed on the gate insulator; source and drain regions respectively formed in portions of the predetermined region that are situated on both sides of the gate electrode in plan view; a contact electrically interconnecting the gate electrode and a body region formed by a region of the predetermined region exclusive of the source and drain regions is formed; and, wherein a portion of the contact which is connected to the gate electrode is formed to intersect the gate electrode in plan view. With such a construction, even if positional deviation of the contact relative to the gate electrode in a direction along the width of the gate electrode occurs, the contact area of the contact in contact with the gate electrode does not vary and, hence, the contact resistance of the contact to the gate electrode can be reduced accordingly.

The portion of the contact which is connected to the gate electrode may be formed to intersect the gate electrode so as to delineate a cross in plan view.

the gate electrode may be formed to protrude outwardly of the source and drain regions in plan view, while the contact may be formed to extend vertically in a manner to embrace a protruding portion of the gate electrode therein. With such a feature, even if positional deviation occurs, the contact area of the contact in contact with the body region varies so as to offset a variation in the contact area of the contact in contact with the gate electrode and, hence, variation in contact resistance can be reduced advantageously.

The contact hole may be formed to extend through the gate insulator upwardly from the body region so as to position the protruding portion of the gate electrode therein, and the contact may be formed by an electric conductor filling the contact hole.

Preferably, when a dimension of the gate electrode along a channel length is $L_{gx}$, a dimension of the contact along the channel length is $L_{cx}$ and a fabrication precision in respect of positional deviation along the channel length between the gate electrode and the contact is $\Delta L_{cgx}$, $L_{cx} > L_{gx} + 2\Delta L_{cgx}$ is satisfied. With such a feature, variation in contact resistance can be reduced suitably.

Preferably, when a dimension of the gate electrode along a channel length is $L_{gx}$, a dimension of the contact along the channel length is $L_{cx}$, a fabrication precision in respect of positional deviation along the channel length between the gate electrode and the contact is $\Delta L_{cgx}$, a fabrication precision in respect of the dimension of the gate electrode along the channel length is $\Delta L_{gx}$ and a fabrication precision in respect of the dimension of the contact along the channel length is $\Delta L_{cx}$, $L_{cx} > L_{gx} + \Delta L_{cx} + L_{gx} + 2\Delta L_{cgx}$ is satisfied. With such a feature, variation in contact resistance can be reduced more suitably.

The contact may comprise a silicide, one component of which is one of W, Ti, Co, Ni, Mo, Ta and Pt.

A portion of the body region which forms a channel may comprise at least one of Si, Ge and C.

The gate insulator may be formed of one of $SiO_2$, SiON, $Si_3N_4$, $ZrO_2$, $HfO_2$ and $Ta_2O_5$.

The foregoing and other objects, features and advantages of the present invention will become apparent from the following detailed description of the preferred embodiments to be read with reference to the accompanying drawings.

DETAILED DESCRIPTION OF THE PREFERRED EMBODIMENTS

Hereinafter, preferred embodiments of the present invention will be described with reference to the drawings.

First Embodiment

Figure 1:
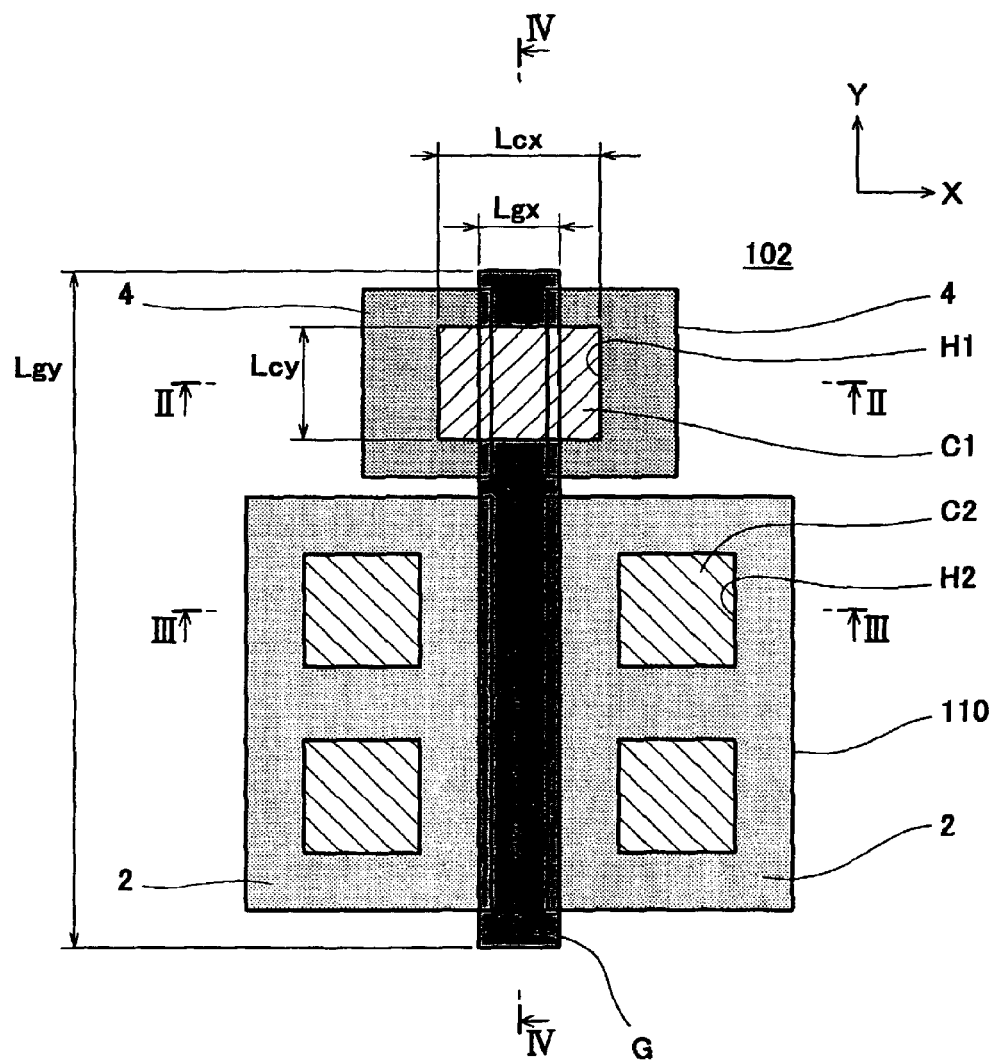
FIG. 1 is a plan view schematically illustrating the structure of a DTMOS as a semiconductor device according to a first embodiment of the present invention.
Figure 2:
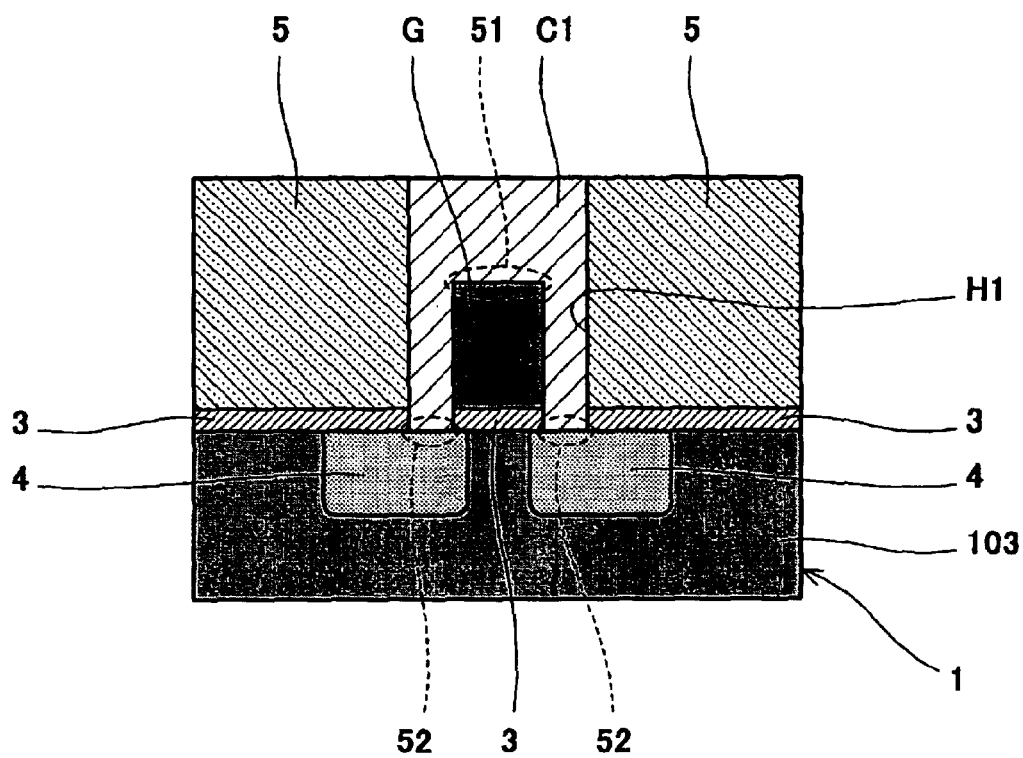
FIG. 2 is a sectional view taken along line II—II of FIG. 1.
Figure 3:
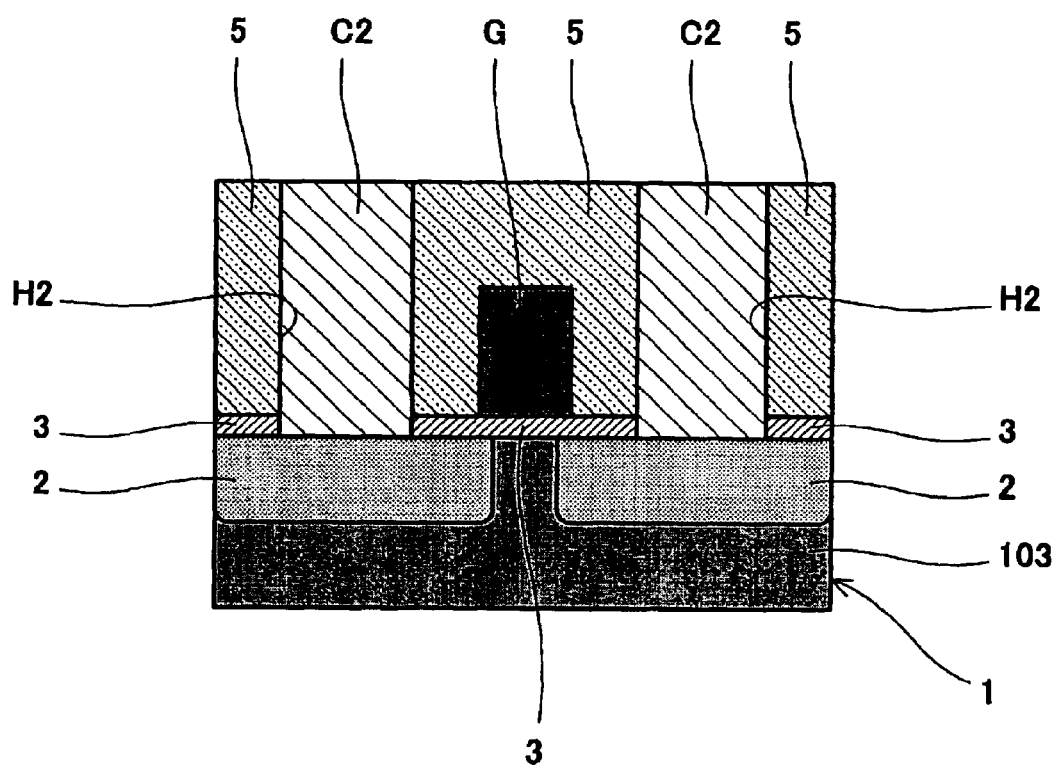
FIG. 3 is a sectional view taken along line III—III of FIG. 1.
Figure 4:
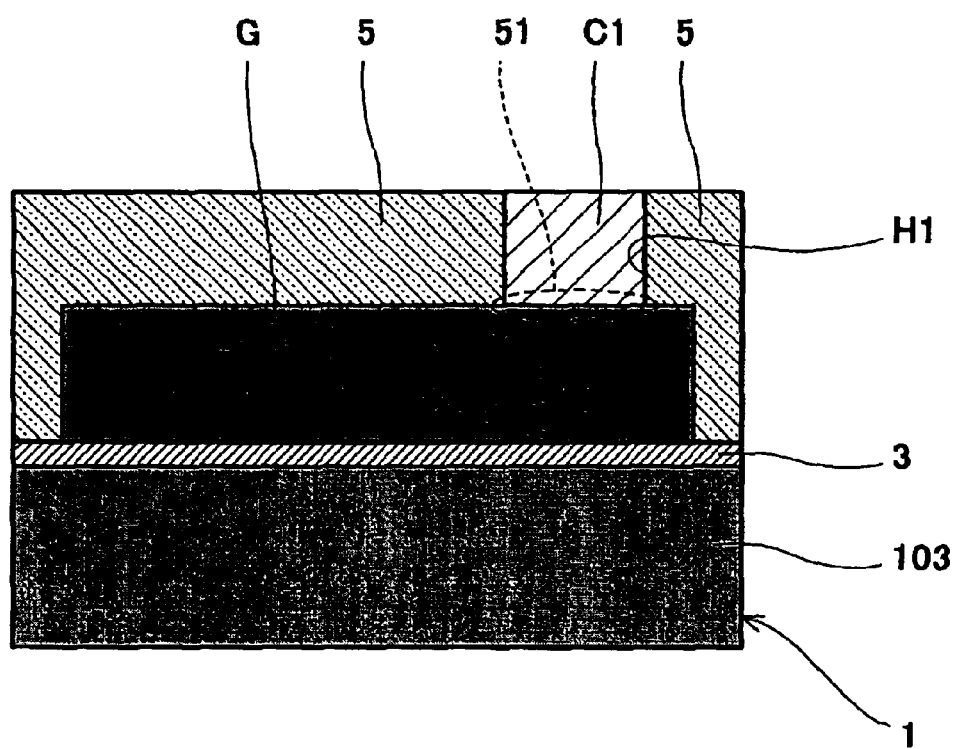
FIG. 4 is a sectional view taken along line IV—IV of FIG. 1.

FIG. 1 is a plan view schematically illustrating the structure of a DTMOS as a semiconductor device according to a first embodiment of the present invention; FIG. 2 is a sectional view taken along line II—II of FIG. 1; FIG. 3 is a sectional view taken along line III—III of FIG. 1; and FIG. 4 is a sectional view taken along line IV—IV of FIG. 1. FIG. 1 is drawn in a see—through fashion for ease of understanding.

FIGS. 1 to 4 illustrate an n-channel DTMOS as a semiconductor device according to this embodiment. In this DTMOS a plurality of device active regions (predetermined regions) 110 isolated from each other by STI (Shallow Trench Isolation) 102 are formed on the surface of a substrate 1. Here, the substrate 1 is constituted of an SOI (Silicon On Insulator) substrate, only a Si layer (designated by reference character 103' in FIG. 5A) thereof formed on a buried insulating film being shown in FIGS. 1 to 4. A gate insulator 3 is formed over each device active region 110, and a gate electrode G is formed on the gate insulator 3. In regions situated directly under the surface of the substrate 1 on both sides of the gate electrode G in plan view, n-type source/drain regions 2 and $p^+$ regions 4 are formed as arranged side by side with a predetermined spacing therebetween in the direction along the width of the gate electrode G (Y direction).

Figure 17:
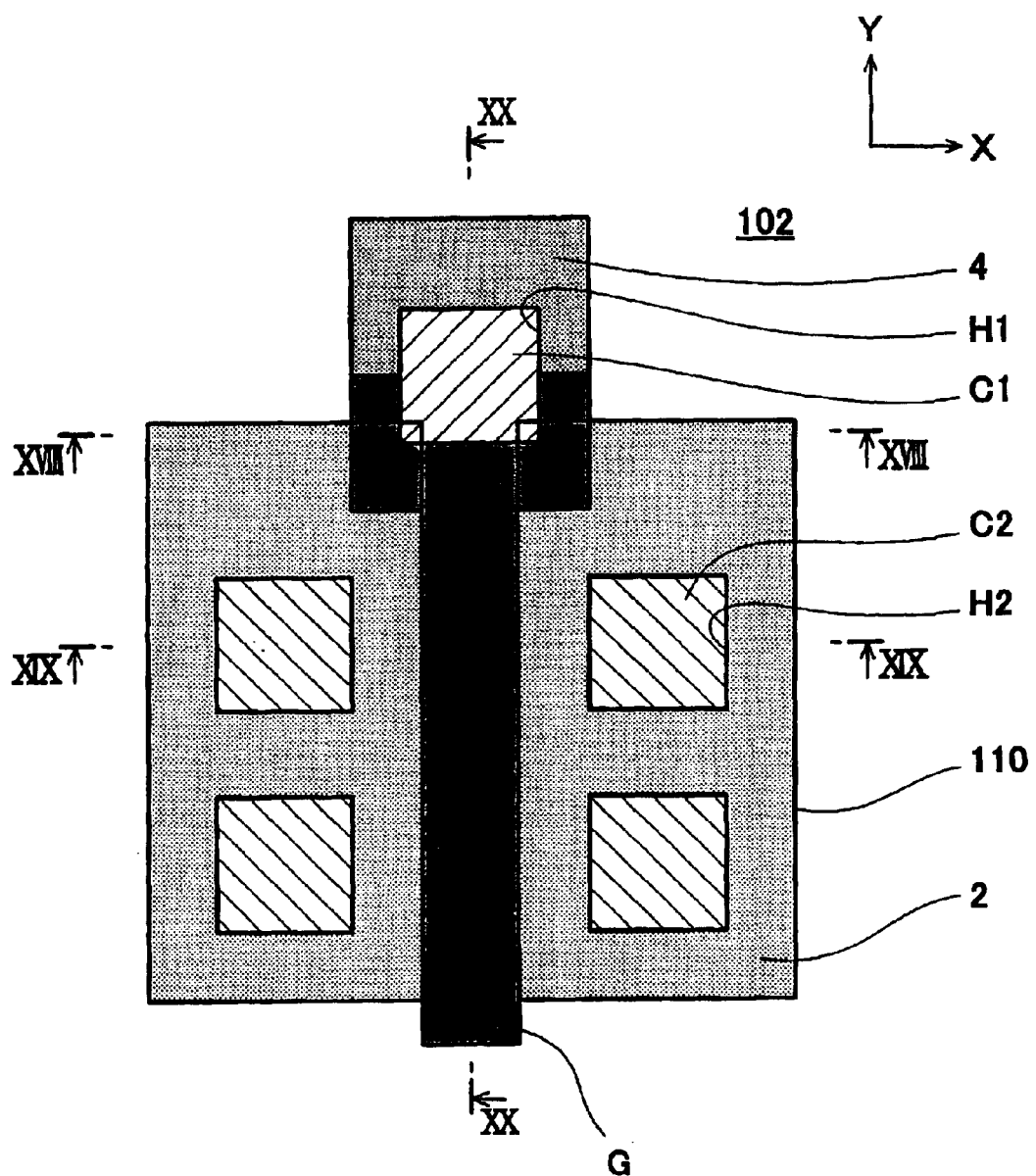
FIG. 17 is a plan view schematically illustrating the connecting structure between the gate electrode and the body region in a conventional DTMOS.
Figure 18:
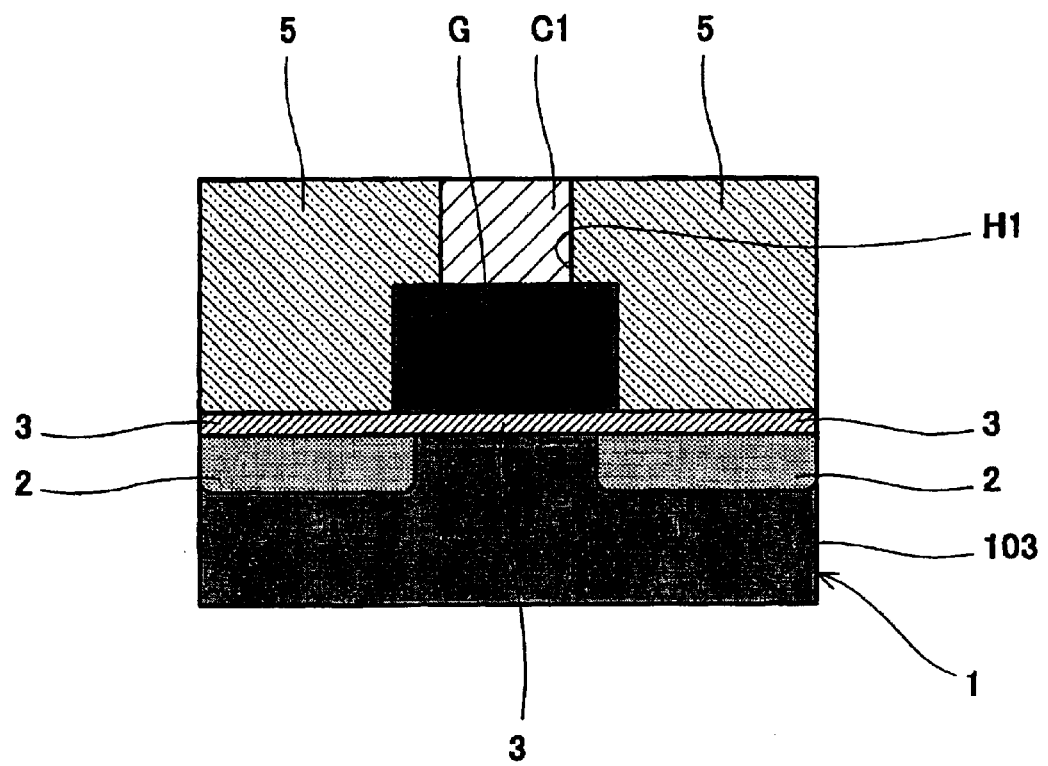
FIG. 18 is a sectional view taken along line XVIII—XVIII of FIG. 17.
Figure 19:
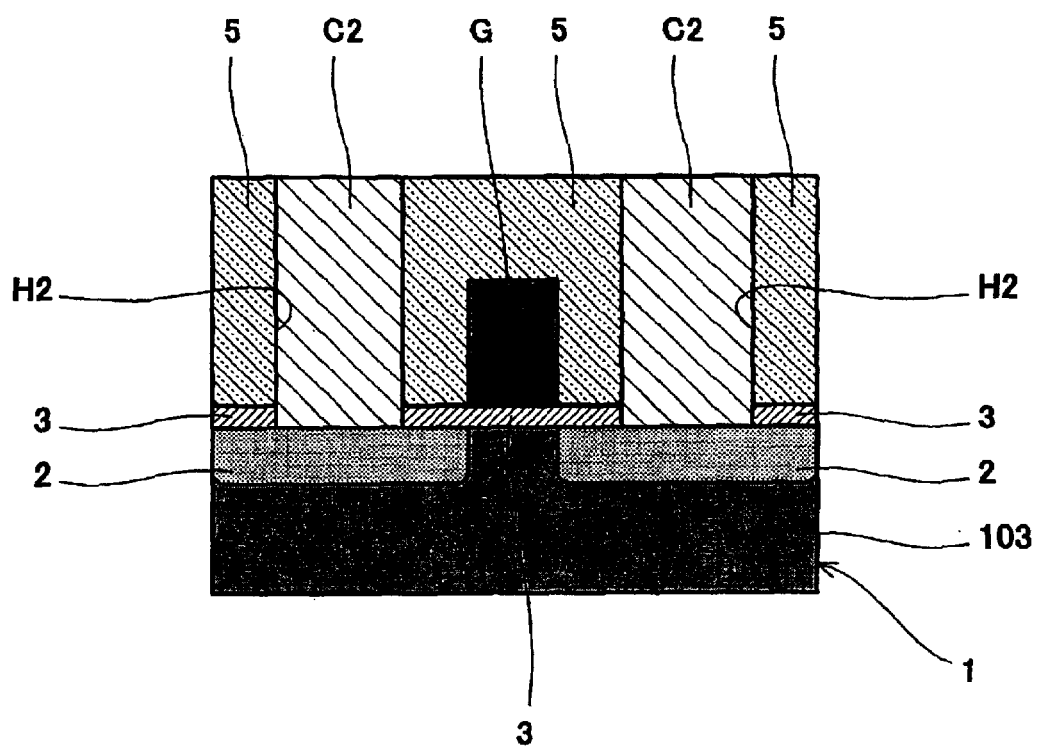
FIG. 19 is a sectional view taken along line XIX—XIX of FIG. 17.
Figure 20:
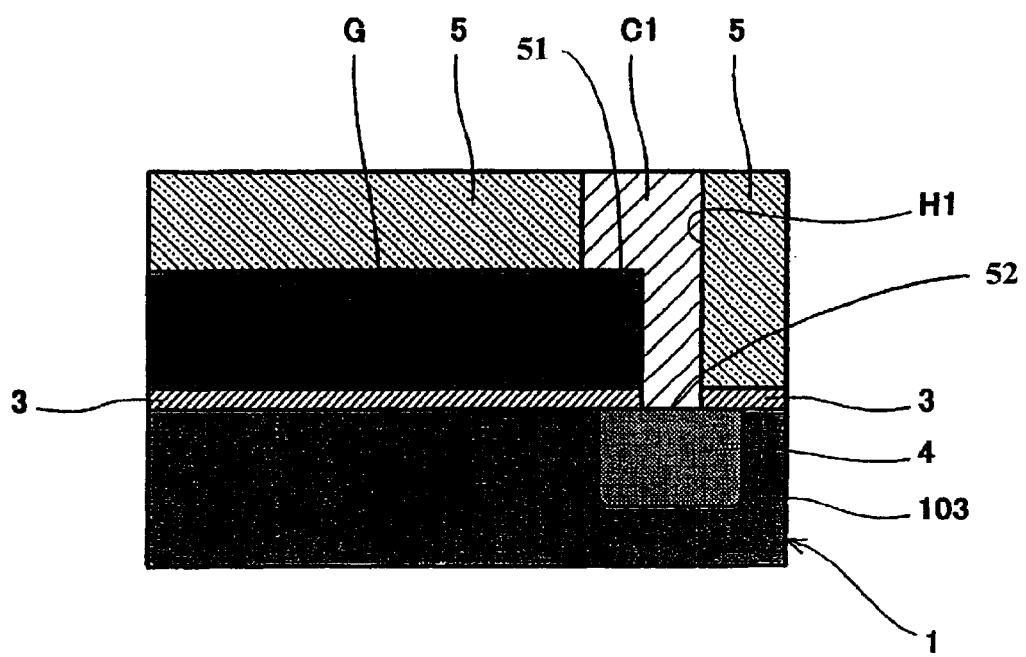
FIG. 20 is a sectional view taken along line XX—XX of FIG. 17.
Figure 21A:
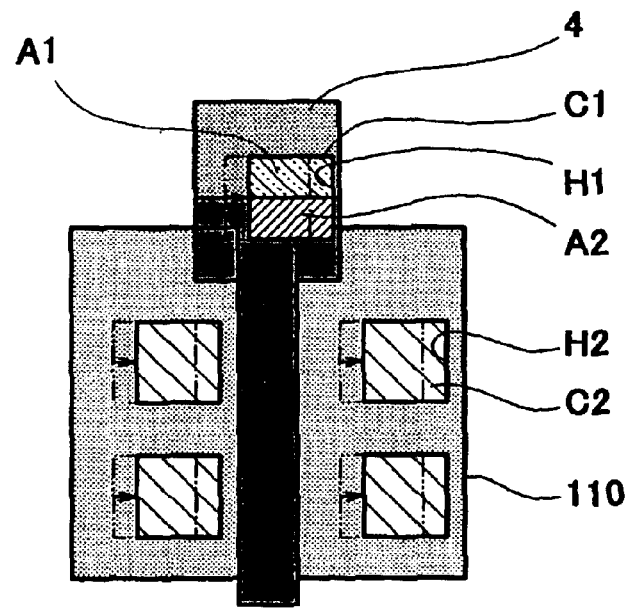
FIGS. 21A and 21B are plan views illustrating positional relations between the gate electrode and the first contact in the conventional DTMOS in the cases where the position of the first contact deviates in the X direction.
Figure 21B:
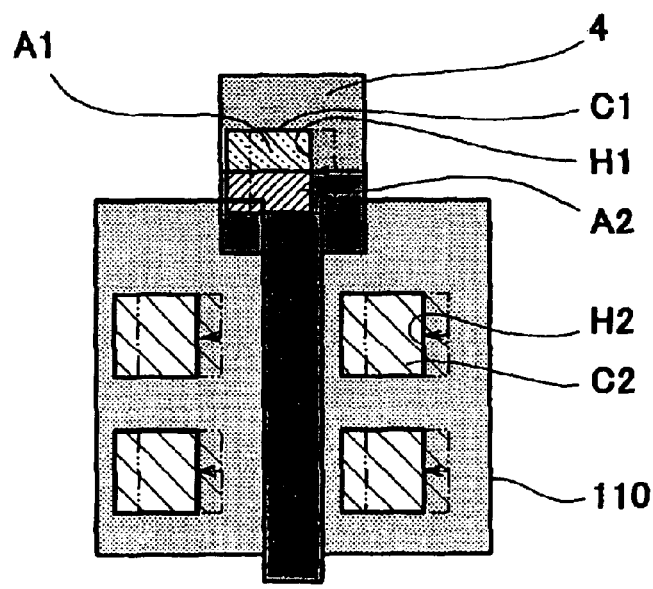
Figure 22A:
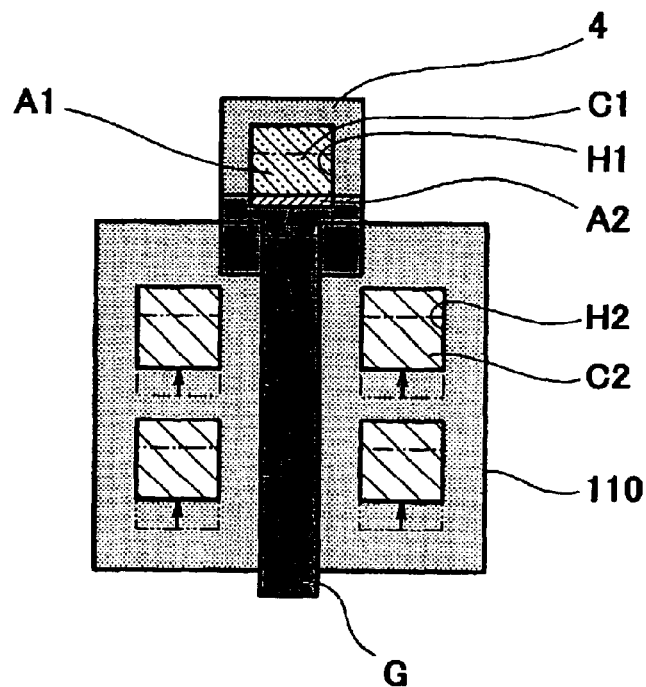
FIGS. 22A and 22B are plan views illustrating positional relations between the gate electrode and the first contact in the conventional DTMOS in the cases where the position of the first contact deviates in the Y direction.
Figure 22B:
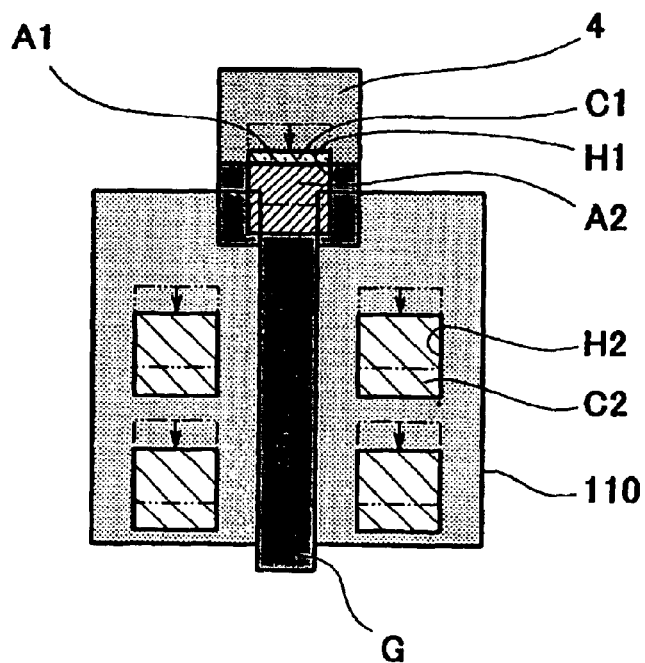

Stated otherwise, unlike the conventional device (as shown in FIG. 17), this embodiment has the gate electrode G formed to extend in the widthwise direction in such a manner as to protrude from the outer boundaries of the source/drain regions 2 and $p^+$ regions 4 formed as arranged side by side in plan view. In operation, one of the pair of source/drain regions 2,2 becomes a source region and the other becomes a drain region while a channel is formed between the source region and the drain region. The pair of $p^+$ regions 4,4 may be connected to each other below the gate electrode G or form a single $p^+$ region having a size equal to the pair of $p^+$ regions 4,4. An interlayer dielectric 5 is formed to cover the gate electrode G and the gate insulator 3. The substrate 1 (exactly speaking, the Si layer thereof is doped into p type. A first contact hole H1 is formed to extend through the gate insulator 3 and the interlayer dielectric 5 so as to interconnect the $p^+$ regions 4 and the gate electrode G. The first contact hole H1 is filled with an electric conductor to form a first contact C1. Thus, the body region 103 of the substrate 1 and the gate electrode G are electrically connected to each other through the sole first contact C1. The first contact C1 also serves as a contact interconnecting the gate electrode G and aluminum wire (indicated at reference character 107 in FIG. 6G). It is to be noted that the $p^+$ regions 4 provide ohmic contact between the first contact C1 formed of a metal and the body region 103 formed of a semiconductor. Reference characters H2 and C2 denote a second contact hole and a second contact, respectively, which interconnect the source/drain regions 2 and the aluminum wire (indicated at reference character 107 in FIG. 6G).

Next, detailed description is made of the connecting structure between the first contact C1 and the gate electrode G, which is characteristic of the present invention. In this embodiment the gate electrode G has a rectangular shape elongated in its widthwise direction (the direction along the channel width) in plan view. Here, the first contact C1 (stated otherwise, the first contact hole H1) has a rectangular cross-sectional shape (in a section parallel with the main surface of the substrate 1) and is formed to extend vertically (in the direction along the thickness of the substrate 1). The first contact C1, having such a rectangular cross-sectional shape, intersects the gate electrode G which has the rectangular planar shape to delineate a cross (i.e., orthogonal intersection) in plan view. Here, it is sufficient that the first contact C1 and the gate electrode G intersect each other at any desired crossing angle. However, it is desirable to intersect to delineate the cross because this is easier to design. The planar shape of the first contact C1 is not limited to a rectangular shape, but needs to have anisotropy at least. However, the first contact C1 preferably has a rectangular shape because such a shape can advantageously prevent the occurrence of variation in contact resistance due to positional deviation and dimensional variation of the first contact C1, as will be described later. The first contact C1 is formed to intersect a portion of the gate electrode G on both sides of which the $p^+$ regions 4 are situated in plan view. A contact portion 51 between the first contact C1 and the gate electrode G is formed by a portion of the first contact C1 having a certain extent in the X direction and an upper surface of the gate electrode G, while a contact portion 52 between the first contact C1 and the $p^+$ regions 4 (hence the body region 103) is formed by the rest of the first contact C1 extending in the X direction and the upper surfaces of the $p^+$ regions 4.

In this embodiment, since the first contact C1 intersects the gate electrode G to delineate the cross, the length of the gate electrode G (the dimension of the gate electrode G along the channel length), the width of the gate electrode G (the dimension of the gate electrode G along the channel width), the length of the first contact C1 (the dimension of the first contact C1 along the channel length) and the width of the first contact C1 (the dimension of the first contact C1 along the channel width) need to satisfy the following formula:

$$L_{gx} < L_{cx} \text{ as well as } L_{gy} > L_{cy} \tag{1}$$

wherein $L_{gx}$ represents the length of the gate electrode G, $L_{gy}$ represents the width of the gate electrode G, $L_{cx}$ represents the length of the first contact C1 and $L_{cy}$ represents the width of the first contact C1. Generally, the gate electrode length $L_{gx}$ and the gate electrode width $L_{gy}$ are determined by the driving power of the transistor and the ability of a device employing the transistor and, hence, the size of the first contact C1 is designed to satisfy the formula (1).

The following description is directed to a method of fabricating the DTMOS of the above-described construction. FIGS. 5A to 5D and FIGS. 6E to 6G are sectional views schematically illustrating a method of fabricating the semiconductor device shown in FIG. 1 step by step. Of these figures the left-hand side figures are sectional views taken along line II—II of FIG. 1 and the right-hand side figures are sectional views taken along line III—III of FIG. 1.

Figure 5A:
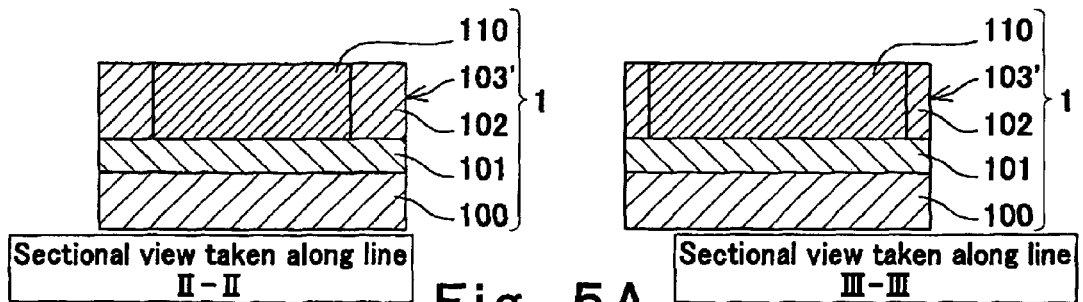
FIGS. 5A to 5D are sectional views schematically illustrating a method of fabricating the semiconductor device shown in FIG. 1 step by step.

First, at the step shown in FIG. 5A, device active regions 110 isolated from each other by STI 102 are formed in Si layer 103' of SOI substrate 1 (body: 100 nm, $SiO_2$ box: 400 nm) and then ions of boron (B) for adjusting the threshold voltage are implanted into each of the device active regions 110 to form a p-type conductive region.

Figure 5B:
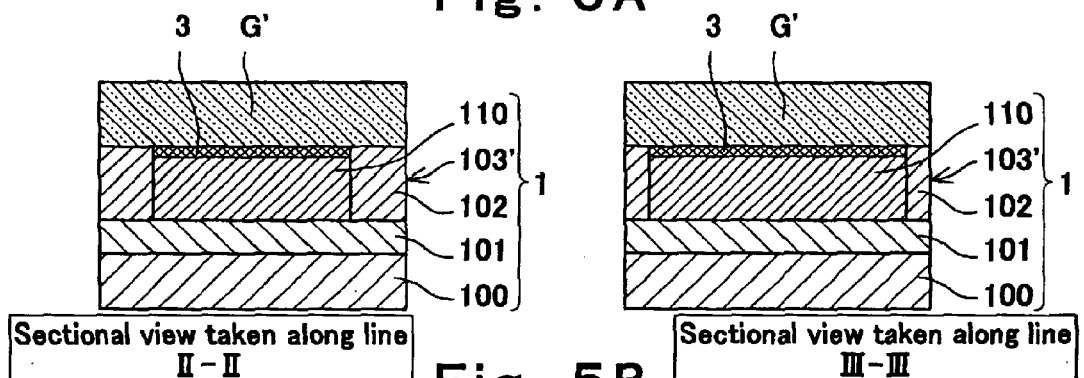

Subsequently, at the step shown in FIG. 5B, gate oxide film 3 (thickness: 6 nm) made of $SiO_2$ is formed as the gate insulator and then a polysilicon film G' that will form the gate electrode is deposited to a thickness of 330 nm, followed by ion implantation of phosphorus (P) to dope the polysilicon film G' into n-type.

Figure 5C:
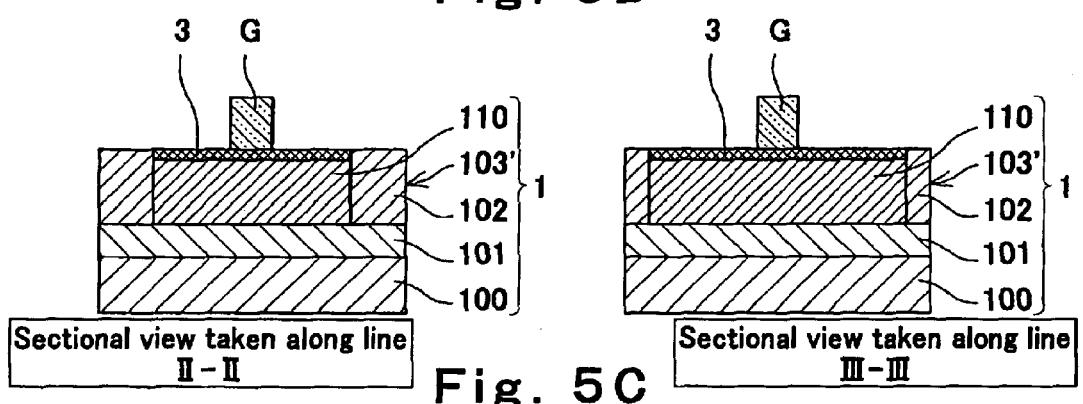

In turn, at the step shown in FIG. 5C, a gate electrode pattern is transferred and the polysilicon film G' is processed by dry etching to form the gate electrode G.

Figure 5D:
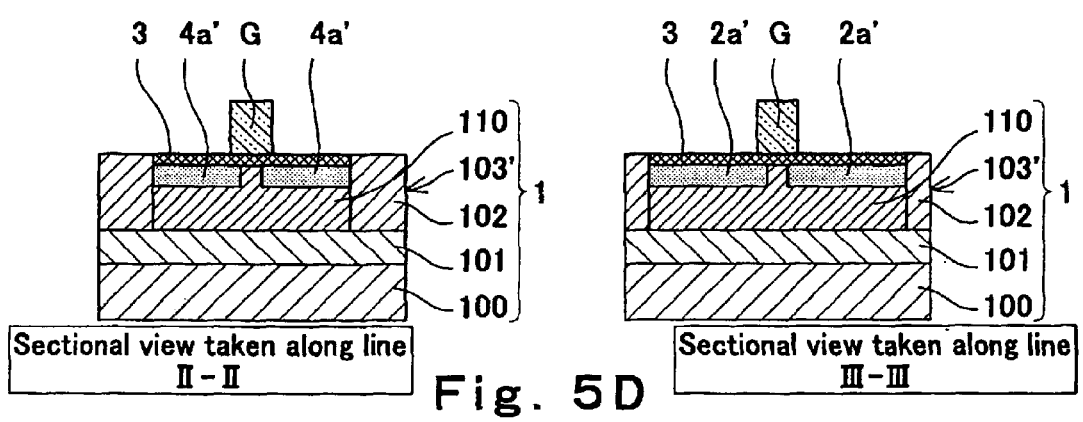

Subsequently, at the step shown in FIG. 5D, a shallow n-implanted layer $2a'$ called an extension (FIG. 5D) is formed by ion implantation of arsenic into a region in which the source/drain regions 2 shown in FIG. 1 are to be formed. On the other hand, boron (B) ions are implanted into a region in which the $p^+$ regions 4 shown in FIG. 1 are to be formed to form a p-implanted layer $4a'$ having a predetermined impurity concentration.

Figure 6E:
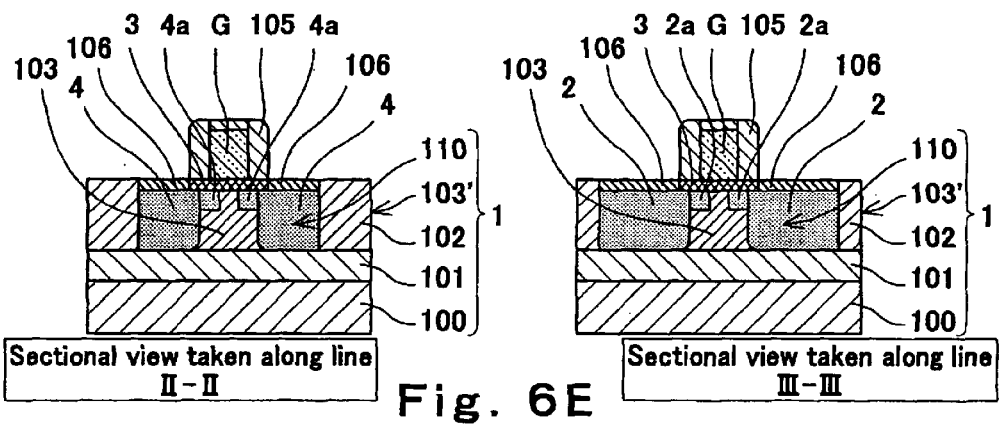
FIGS. 6E to 6G are sectional views schematically illustrating a method of fabricating the semiconductor device shown in FIG. 1 step by step.

In turn, at the step shown in FIG. 6E, sidewall oxide film 105 called "sidewall" is formed to cover the sidewalls of the gate electrode G. Thereafter, phosphorus (P) ions are implanted into the surface of the substrate 1, in the region in which the source/drain regions shown in FIG. 1 are to be formed, to form the source/drain regions 2, while the region in which the $p^+$ regions shown in FIG. 1 are to be formed is ion-implanted with boron (B) at a high concentration to form the $p^+$ regions 4. As a result, conductive regions $2a$ and $4a$ having lower impurity concentrations than the source/drain regions 2 and the $p^+$ regions 4, respectively, are formed below the gate electrode. Since these conductive regions $2a$ and $4a$ have no relation to the present invention, they are omitted from FIGS. 1 to 4. The portion of the device active region 110 exclusive of the source/drain regions 2 (and the conductive region $2a$) becomes the body region 103.

Figure 6F:
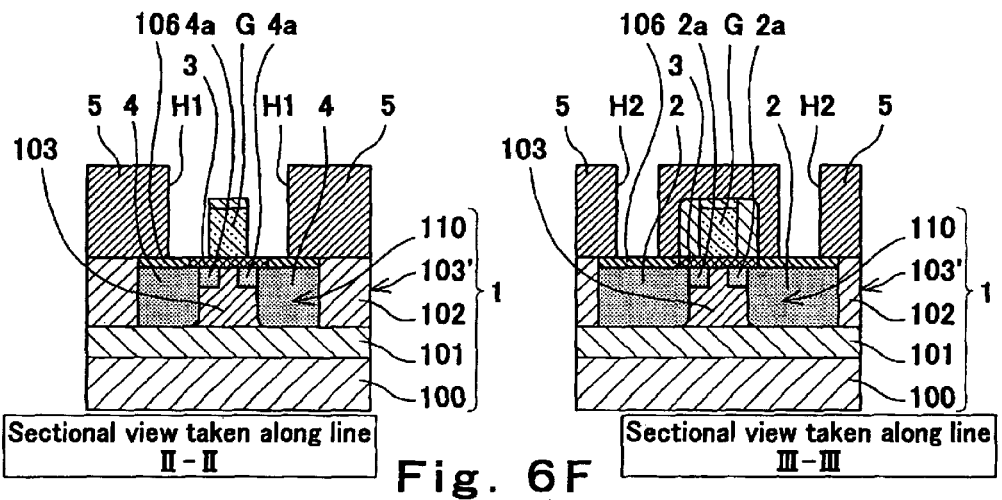

Subsequently, at the step shown in FIG. 6F, an exposed silicon surface is turned into a silicide to reduce the gate resistance and the contact resistance. The resulting silicide layer is indicated at reference character 106. Here, titanium silicide ($TiSi_2$) is used. Other usable silicides comprise, for example, W, Co, Ni, Mo, Ta, and Pt, respectively, as one component thereof. Then, an interlayer dielectric consisting of an oxide film is deposited to a predetermined thickness and, thereafter, a contact hole pattern is transferred, followed by formation of contact holes H1 and H2 by dry etching. Here, use of a $CF_4$-type or $CHF_3$-type gas in dry etching of an oxide film in general can provide a sufficient selective ratio with respect to polysilicon. Thus, it is possible to form the first contact hole H1 interconnecting the gate electrode G and the body region 103 in a manner to position the gate electrode G therein as shown in FIG. 6F, with the polysilicon forming the gate electrode G being hardly etched. In this embodiment such a contrivance is needed to form the first contact hole H1 which intersects the gate electrode G made of polysilicon to delineate a cross in plan view.

Figure 6G:
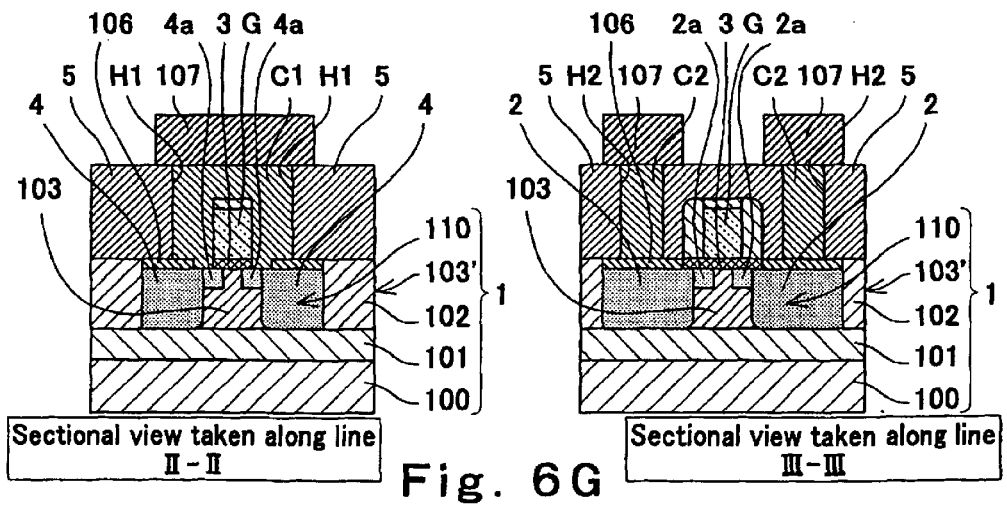

Subsequently, at the step shown in FIG. 6G, the first and second contact holes H1 and H2 are filled with tungsten (W) by a W-CVD method, thus forming the first and second contacts C1 and C2. Thereafter, aluminum wire 107 is formed to connect to the upper ends of the first and second contacts C1 and C2. In this way the DTMOS is completed.

Next, detailed description is made of the operation and advantages of the DTMOS thus constructed.

Figure 7A:
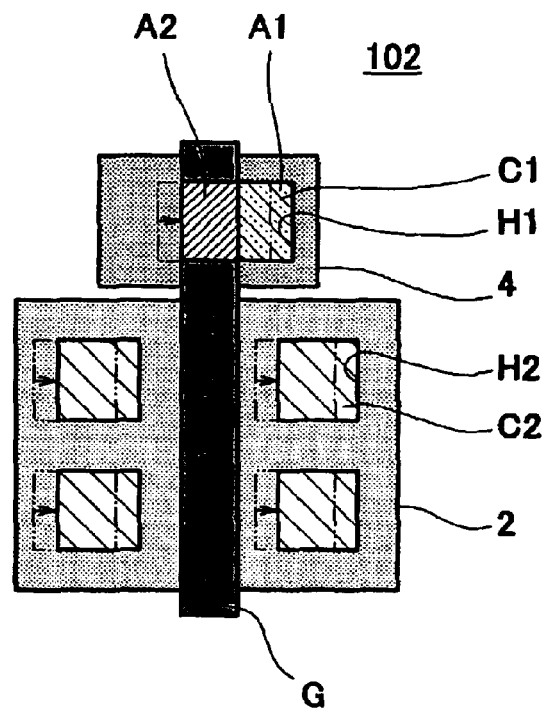
FIGS. 7A and 7B are plan views illustrating positional relations between the gate electrode and the first contact in the DTMOS according to the first embodiment of the present invention in the cases where the position of the first contact deviates in the X direction.
Figure 7B:
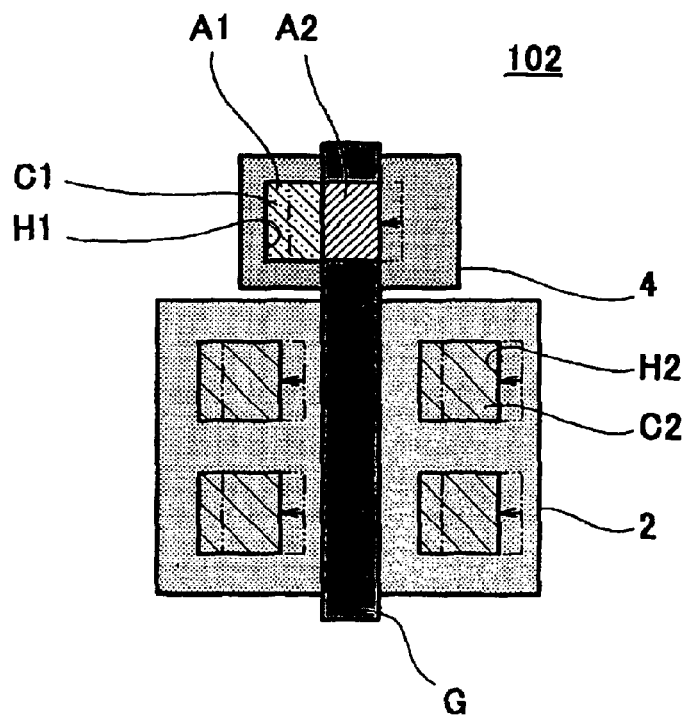
Figure 8A:
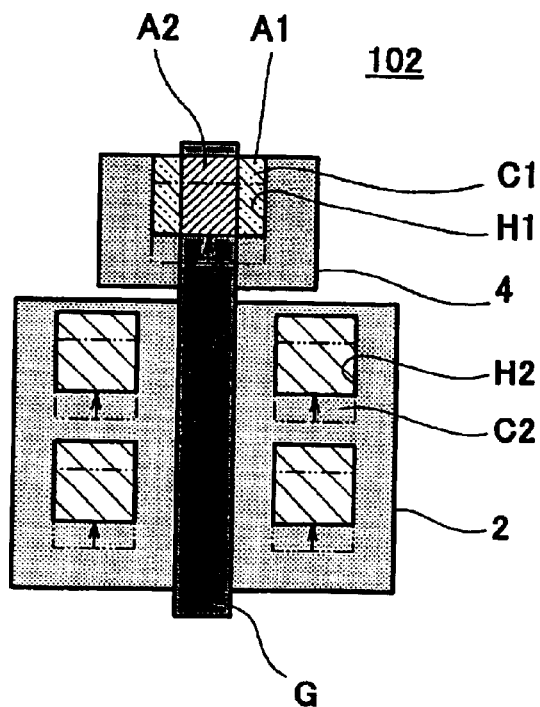
FIGS. 8A and 8B are plan views illustrating positional relations between the gate electrode and the first contact in the DTMOS according to the first embodiment of the present invention in the cases where the position of the first contact deviates in the Y direction.
Figure 8B:
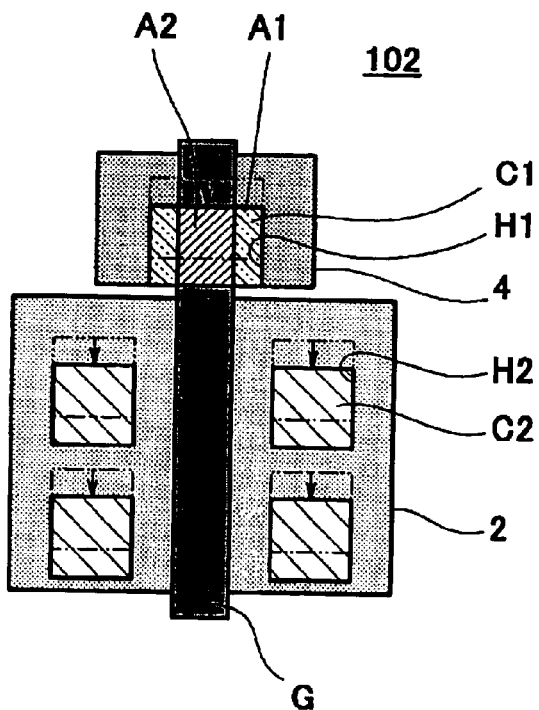

FIGS. 7A and 7B and FIGS. 8A and 8B are plan views illustrating positional relations between the gate electrode and the first contact in the DTMOS according to this embodiment; specifically, FIGS. 7A and 7B illustrate the cases where the position of the first contact deviates in the X direction while FIGS. 8A and 8B illustrate the cases where the position of the first contact deviates in the Y direction.

As apparent from FIGS. 7A and 7B and 8A and 8B, in the DTMOS of this embodiment the contact area A2 between the gate electrode G and the first contact C1 is $L_{gx} \times L_{cy}$ even when the position of the first contact C1 deviates in either direction, the X direction or the Y direction and, therefore, the contact area A2 is kept constant independently of positional deviation of the first contact C1.

With regard to the contact portion between the first contact C1 and the body region 103 ($p^+$ regions 4), the contact portion is divided into two on both sides of the gate electrode G centered. When the position of the first contact C1 deviates in the +X direction (toward the right-hand side in the figure) relative to the gate electrode G, the area of a contact portion situated in the -X direction relative to the gate electrode G decreases whereas the area of a contact portion situated in the +X direction relative to the gate electrode G increases so as to compensate for the decrease and, thus, the contact area A1 of the first contact C1 in contact with the body region 103 can be expressed as: $(L_{cx} - L_{gx}) \times L_{cy}$.

When the position of the first contact C1 deviates in the -X direction (toward the left-hand side in the figure) relative to the gate electrode G, the contact area A1 of the first contact C1 in contact with the body region 103 is kept constant as in the former case.

When the position of the first contact C1 deviates in the Y direction relative to the gate electrode G, the contact area A1 of the first contact C1 in contact with the body region 103 is not influenced by such positional deviation as shown in FIGS. 8A and 8B and, hence, it is apparent that the contact area A1 is kept constant ($(L_{cx} - L_{gx}) \times L_{cy}$).

Thus, according to this embodiment, the contact areas A2 and A1 of the first contact c1 in contact with the gate electrode G and the body region 103, respectively, can be kept constant even when positional deviation of the first contact C1 relative to the gate electrode G occurs, so that the contact resistance of the first contact C1 is kept constant. As a result, it becomes possible to suppress variation in the contact resistance of the first contact C1.

Though the DTMOS formed on the SOI substrate is illustrated in this embodiment, it is needless to say that advantages similar to those described above can be obtained even if a bulk substrate is used instead of the SOI substrate.

The channel region of the body region 103, which is formed by Si in this embodiment, may be formed by a hetero-junction layer comprising either or both of Ge and C. Also, the channel region, which is formed by a p-type conductive region in this embodiment, may be formed of an undoped semiconductor region.

The gate insulator 3, which is made of $SiO_2$ in this embodiment, may be made of any one of $SiON$, $Si_3N_4$, $ZrO_2$, $HfO_2$ and $Ta_2O_5$, for example.

While the present invention is applied to an n-channel DTMOS in this embodiment, the present invention is also applicable to a p-channel DTMOS.

Second Embodiment

Figure 9:
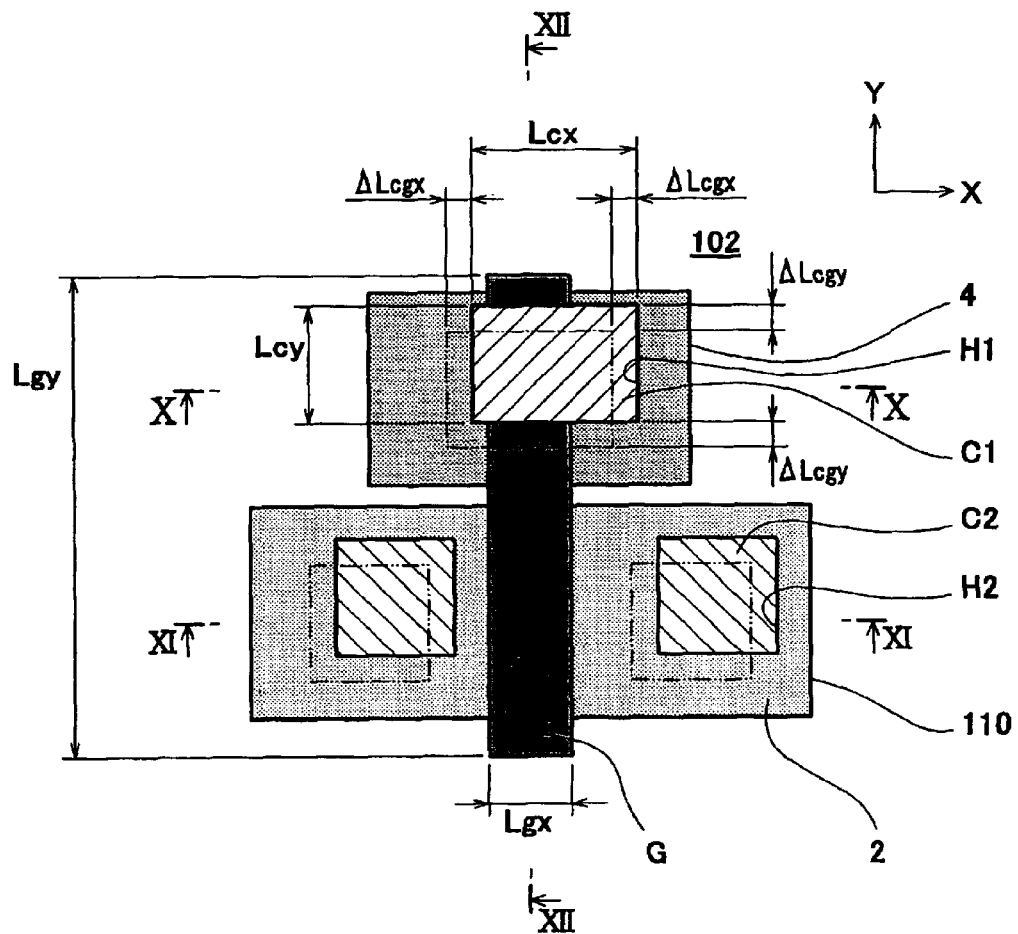
FIG. 9 is a plan view schematically illustrating the structure of a DTMOS as a semiconductor device in which allowable ranges of positional deviation of the contact and the like are taken into consideration according to a second embodiment of the present invention.
Figure 10:
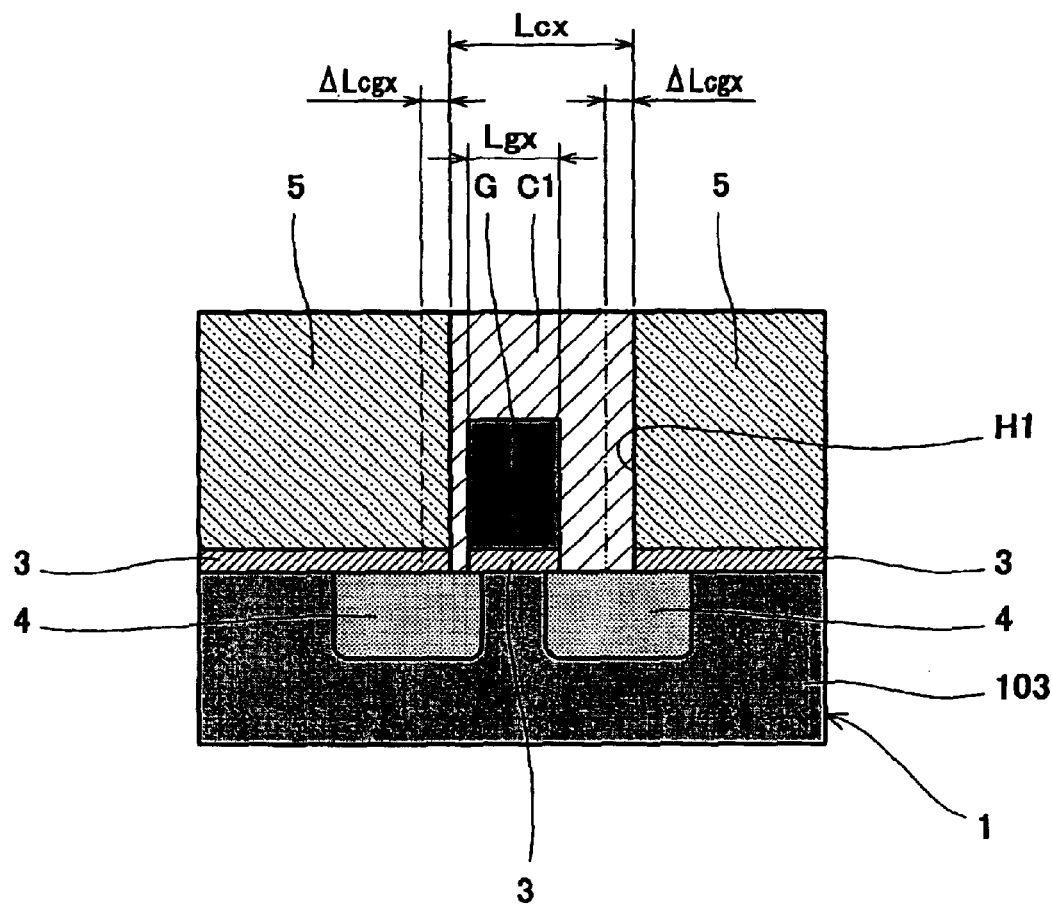
FIG. 10 is a sectional view taken along line X—X of FIG. 9.
Figure 11:
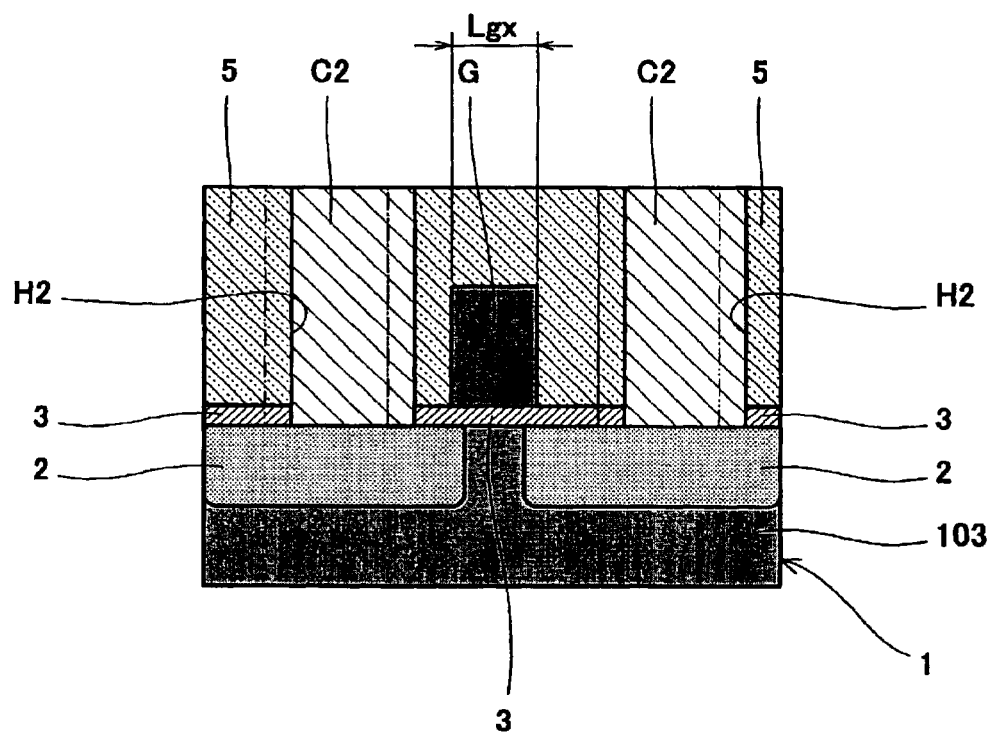
FIG. 11 is a sectional view taken along line XI—XI of FIG. 9.
Figure 12:
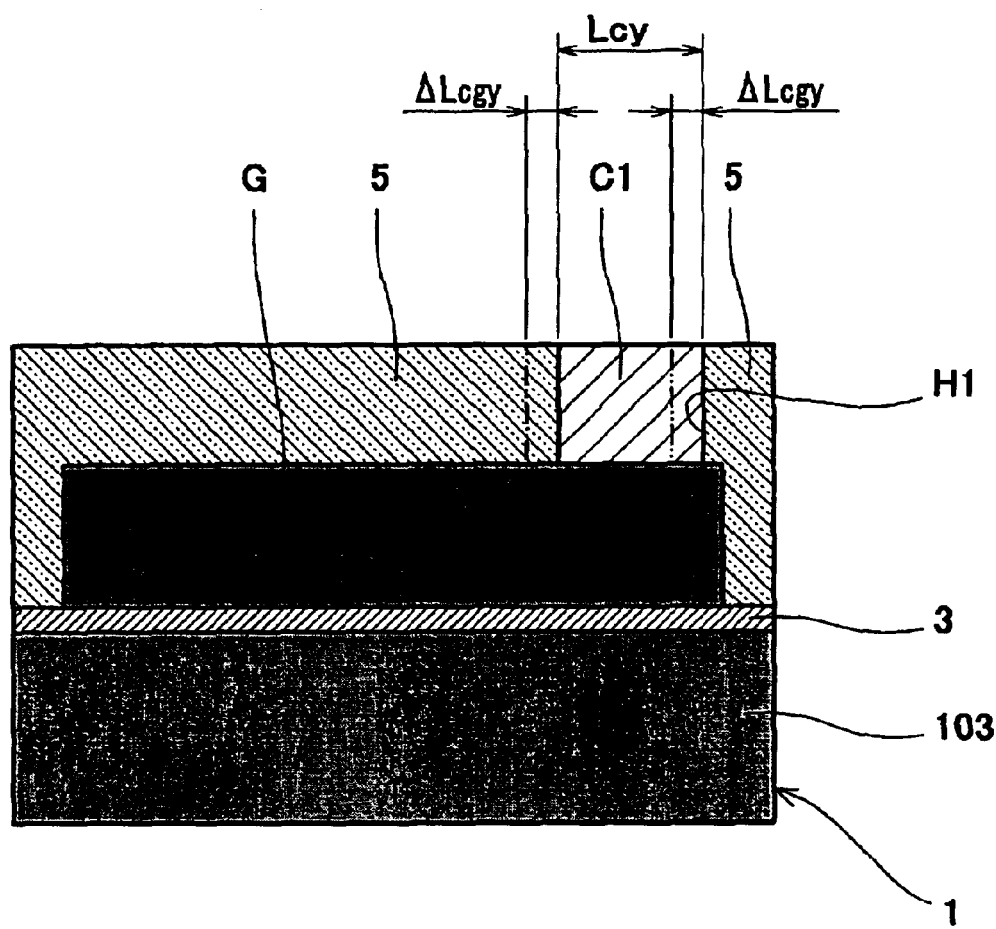
FIG. 12 is a sectional view taken along line XII—XII of FIG. 9.
Figure 13:
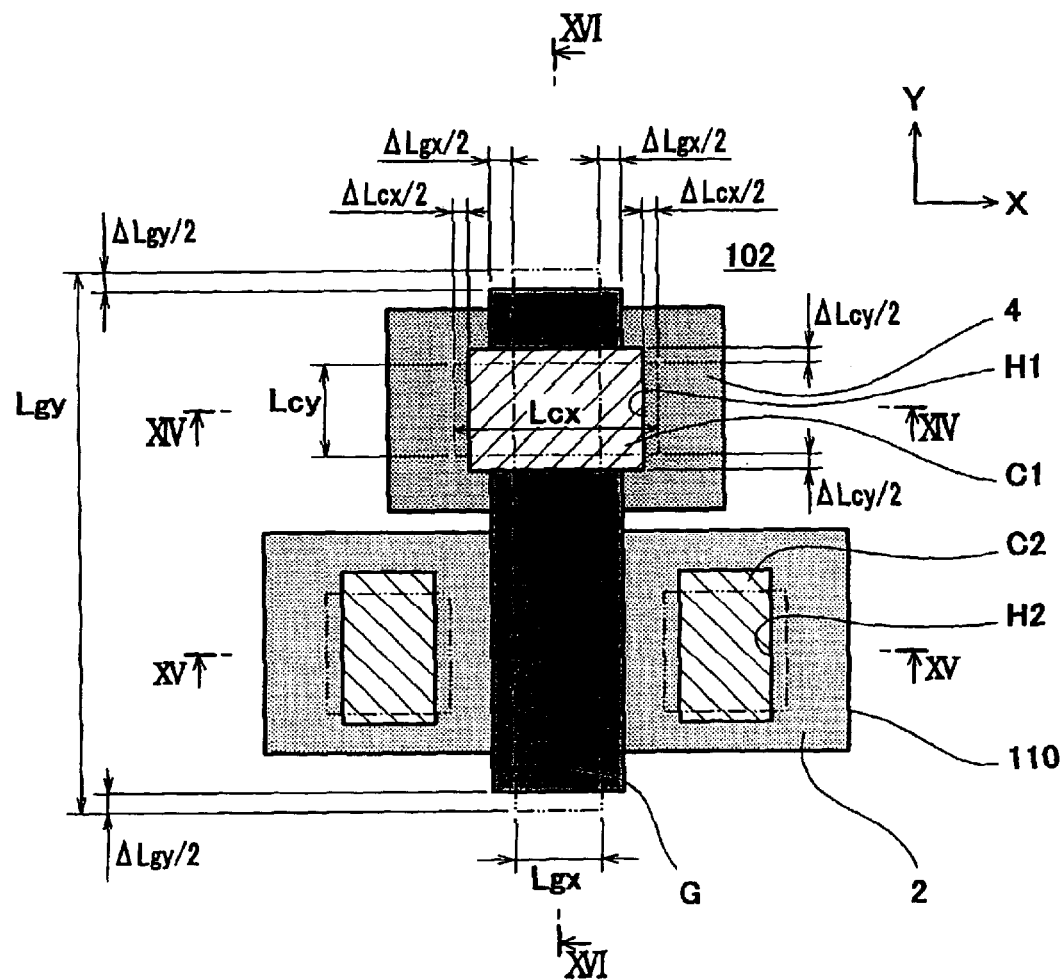
FIG. 13 is a plan view schematically illustrating the structure of a DTMOS as a semiconductor device in which allowable ranges of positional deviation of the contact and the like are taken into consideration according to the second embodiment of the present invention.
Figure 14:
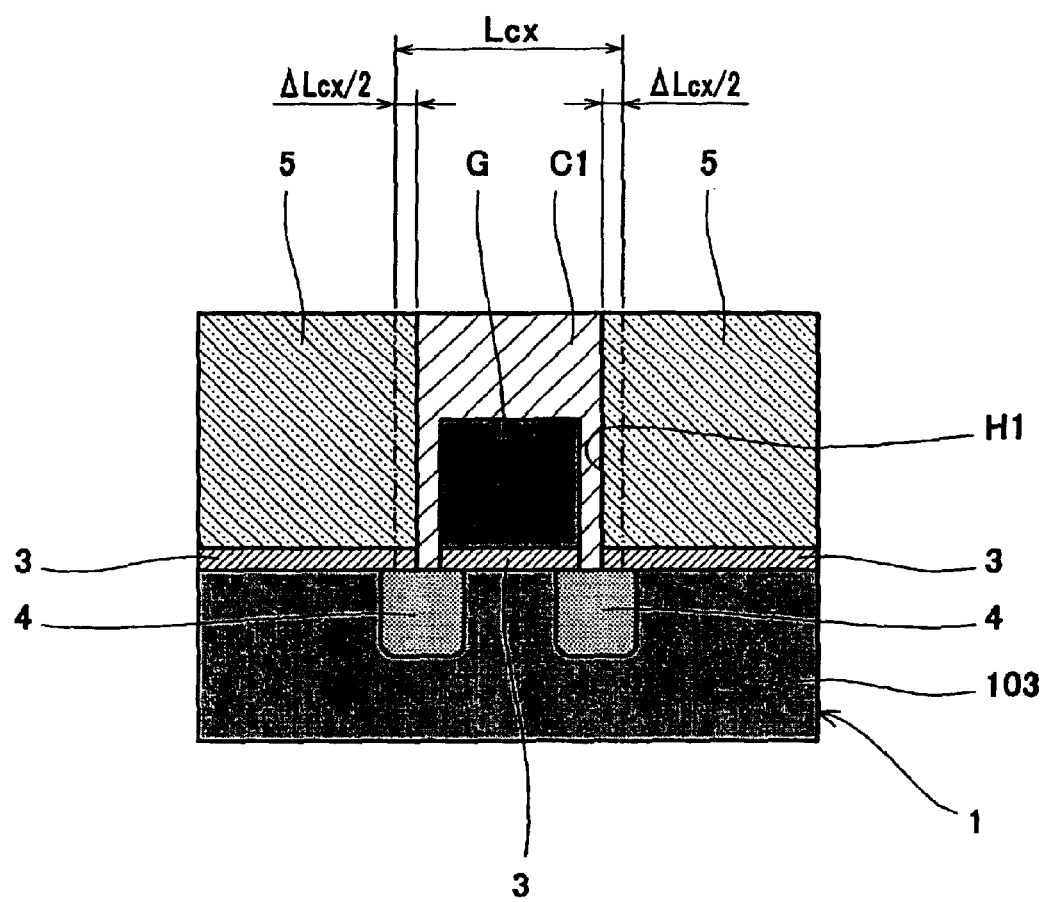
FIG. 14 is a sectional view taken along line XIV—XIV of FIG. 13.
Figure 15:
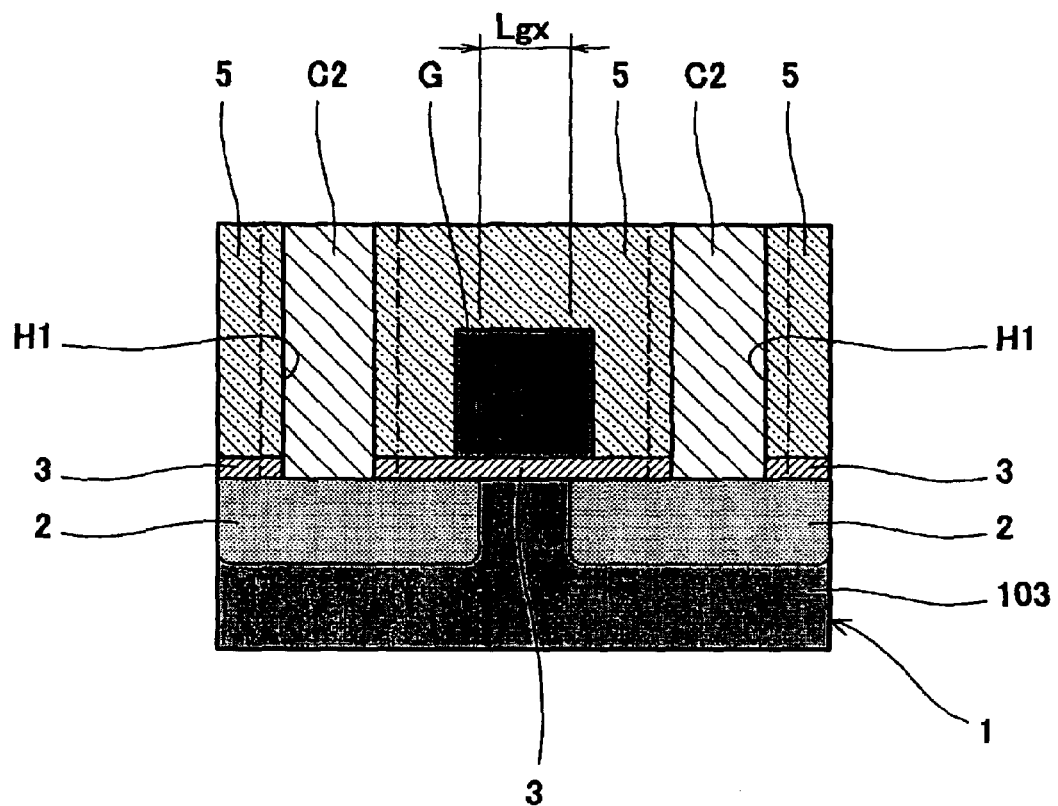
FIG. 15 is a sectional view taken along line XV—XV of FIG. 13.
Figure 16:
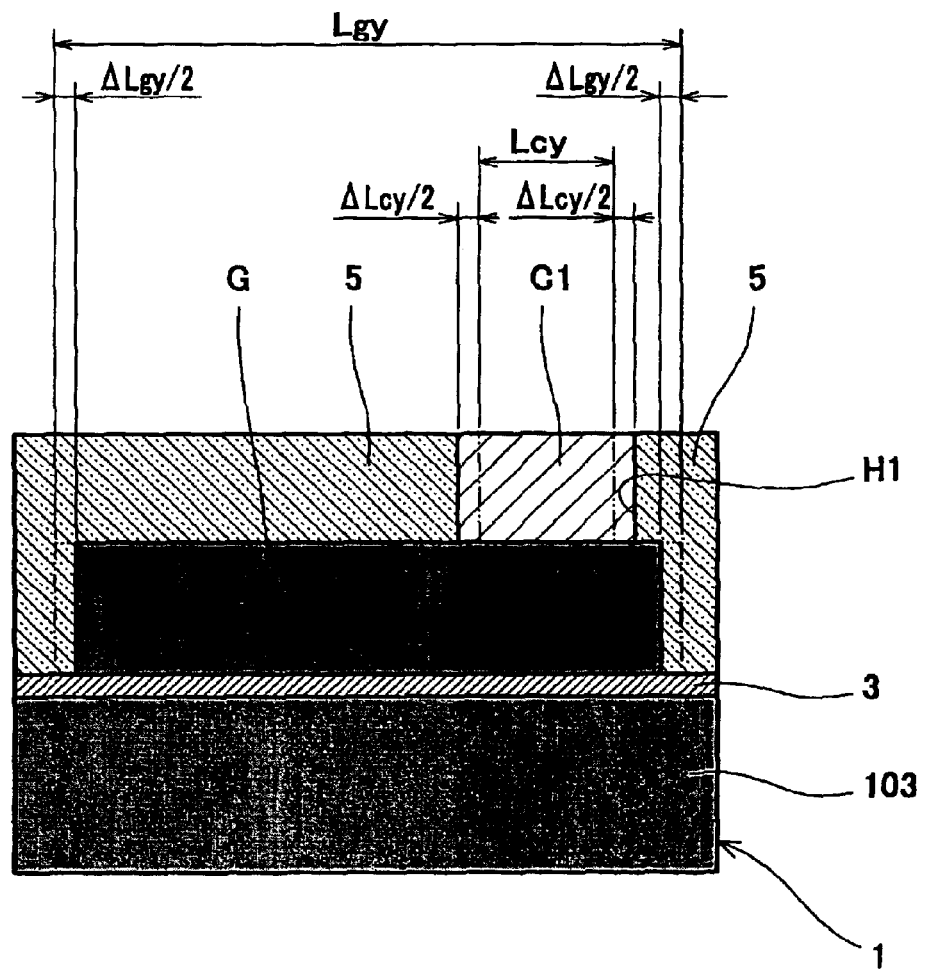
FIG. 16 is a sectional view taken along line XVI—XVI of FIG. 13.

FIG. 9 is a plan view schematically illustrating the structure of a DTMOS as a semiconductor device in which allowable ranges of positional deviation of a contact and the like are taken into consideration according to a second embodiment of the present invention; FIG. 10 is a sectional view taken along line X—X of FIG. 9; FIG. 11 is a sectional view taken along line XI—XI of FIG. 9;

FIG. 12 is a sectional view taken along line XII—XII of FIG. 9. FIG. 13 is a plan view schematically illustrating the structure of a DTMOS as a semiconductor device in which allowable ranges of dimensional variation of a contact and the like are taken into consideration according to the second embodiment of the present invention; FIG. 14 is a sectional view taken along line XIV—XIV of FIG. 13; FIG. 15 is a sectional view taken along line XV—XV of FIG. 13; FIG. 16 is a sectional view taken along line XVI—XVI of FIG. 13. Like reference characters as used in FIGS. 1 to 4 designate like or corresponding parts shown in FIGS. 9 to 16.

In this embodiment, allowable ranges of positional deviation and dimensional variation of the first contact and the gate electrode in the DTMOS of the first embodiment are shown.

Specifically, positional deviation necessarily occurs at the step of transferring a mask pattern to a substrate in semiconductor device fabrication processes. As described earlier in the Description of the Related Art, an amount of positional deviation is a value which depends on the performance of fabrication equipment used and the environment where the equipment is used and, in semiconductor fabrication plants, the equipment is controlled such that the amount of positional deviation falls within a certain range. In this respect, a margin corresponding to a positional deviation needs to be provided for the length of the first contact C1 in the X direction so that the first contact C1 intersects the gate electrode G to delineate a cross even when positional deviation occurs. In the Y direction also, a margin corresponding to a positional deviation need be provided for the width of the gate electrode G.

Specific description of such margins follows.

[Allowable Range of Positional Deviation]

Referring to FIGS. 9 to 12, consideration is given to the case where the position of the first contact C1 relative to the gate electrode G deviates maximally within equipment-control allowable ranges in both the X direction and the Y direction, which is the worst case. In this case, it is assumed that positional deviation occurs in both the +X direction and the +Y direction.

It is also assumed that the length of the gate electrode is $L_{gx}$, the width of the gate electrode is $L_{gy}$, the length of the first contact C1 is $L_{cx}$, the width of the first contact C1 is $L_{cy}$, a maximum amount of positional deviation of the first contact C1 relative to the gate electrode G in the X direction is $\Delta L_{cgx}$ and a maximum amount of positional deviation of the first contact C1 relative to the gate electrode G in the Y direction is $\Delta L_{cgy}$.

In this case, in order for the first contact C1 and the gate electrode G to realize a satisfactory cross-shaped contact therebetween, the first contact C1 should have a size having a margin of $\Delta L_{cgx}$ for the length and a margin of $\Delta L_{cgy}$ for the width on one side. Actually, such margins are necessary on both sides and, hence, the following formulae should be satisfied.

$$L_{cx} > L_{gx} + 2\Delta L_{cgx} \tag{2}$$

$$L_{gy} > L_{cy} + 2\Delta L_{cgy} \tag{3}$$

Stated otherwise, assuming that $\Delta L_{cgx}$ and $\Delta L_{cgy}$ are a fabrication precision in respect of positional deviation of the first contact C1 relative to the gate electrode G in the X direction and a fabrication precision in respect of positional deviation of the first contact C1 relative to the gate electrode G in the Y direction, respectively, it is sufficient for the size of the first contact C1 to be designed so as to satisfy the formulae (2) and (3).

[Allowable Range of Dimensional Variation]

An allowable range of dimensional variation in the X direction and an allowable range of dimensional variation in the Y direction will be described separately.

<Allowable Range of Dimensional Variation in the X Direction>

Referring to FIGS. 13 to 16, consideration is given to the case where the dimension of the first contact C1 in the X direction decreases to a minimum within an equipment-control allowable range while the dimension of the gate electrode G in the X direction increases to a maximum within an equipment-control allowable range, which is the worst case. Here, assuming that a maximum amount of dimensional variation of the first contact C1 in the X direction is $\Delta L_{cx}$ and a maximum amount of dimensional variation of the gate electrode G in the X direction is $\Delta L_{gx}$, maximum amounts of dimensional variation of the first contact C1 and the gate electrode G on one side are $\Delta L_{cx}/2$ and $\Delta L_{gx}/2$, respectively.

In this case, in order for the first contact C1 and the gate electrode G to realize a satisfactory cross-shaped contact therebetween, the varied length of the first contact C1 should exceed the varied length of the gate electrode G and, hence, the following formula should be satisfied.

$$L_{cx} - \Delta L_{cx} > L_{gx} \Delta L_{gx}, \text{ that is, } L_{cx} > L_{gx} + \Delta L_{gx} + \Delta L_{cx} \tag{4}$$

If positional deviation is also taken into consideration, it follows that:

$$L_{cx} > L_{gx} + \Delta L_{gx} + \Delta L_{cx} + 2\Delta L_{cgx} \tag{5}$$

<Allowable Range of Dimensional Variation in the Y Direction>

Referring to FIGS. 13 to 16 again, consideration is given to the case where the dimension of the first contact C1 in the Y direction increases to a maximum within an equipment-control allowable range while the dimension of the gate electrode G in the Y direction decreases to a minimum within a range of equipment-control allowable range, which is the worst case. Here, assuming that a maximum amount of dimensional variation of the first contact C1 in the Y direction is $\Delta L_{cy}$ and a maximum amount of dimensional variation of the gate electrode G in the Y direction is $\Delta L_{gy}$, maximum amounts of dimensional variation of the first contact C1 and the gate electrode G on one side are $\Delta L_{cy}/2$ and $\Delta L_{gy}/2$, respectively.

In this case, in order for the first contact C1 and the gate electrode G to realize a satisfactory cross-shaped contact therebetween, the varied width of the first contact C1 should exceed the varied width of the gate electrode G and, hence, the following formula should be satisfied.

$$L_{gy} > L_{cy} + \Delta L_{gy} + \Delta L_{cy} \quad (6).$$

If positional deviation is also taken into consideration, it follows that:

$$L_{gy} > L_{cy} + \Delta L_{gy} + \Delta L_{cy} + 2\Delta L_{cgy} \quad (7)$$

Stated otherwise, assuming that $\Delta L_{gx}$, $\Delta L_{gy}$, $\Delta L_{cx}$ and $\Delta L_{cy}$, respectively, are fabrication precisions in respect of dimensional variation of the gate electrode G and the first contact C1 in the X direction and the Y direction, it is sufficient for the size of the first contact C1 to be designed so as to satisfy the formulae (4) to (7).

As described above, according to this embodiment, variation in contact resistance due to positional deviation and dimensional variation can be suitably suppressed if the respective sizes of the first contact C1 and the gate electrode G are determined so as to satisfy the formulae (2) to (7).

It will be apparent from the foregoing description that many improvements and other embodiments of the present invention occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

The semiconductor device according to the present invention is useful as a transistor for use in personal digital assistant devices.

What is claimed is:

1. A semiconductor device comprising: a semiconductor substrate; a gate insulator formed over a predetermined region of the semiconductor substrate; a gate electrode formed on the gate insulator; source and drain regions respectively formed in portions of the predetermined region that are situated on both sides of the gate electrode in plan view; a body region formed by a region of the predetermined region exclusive of the source and drain regions; and a contact electrically interconnecting the gate electrode and the body region, wherein said gate electrode extends in a channel width direction through said contact to substantially intersect both sides of an outermost periphery of said contact in the channel width direction as seen in plan view.

2. The semiconductor device according to claim 1, wherein the portion of the contact which is connected to the gate electrode is formed to intersect the gate electrode so as to delineate a cross in plan view.

3. The semiconductor device according to claim 1, wherein the gate electrode is formed to protrude outwardly of the source and drain regions in plan view, while the contact is formed to extend vertically so as to embrace a protruding portion of the gate electrode therein.

4. The semiconductor device according to claim 1, wherein the contact hole is formed to extend through the gate insulator upwardly from the body region and to position a protruding portion of the gate electrode therein, and the contact is formed by an electric conductor filling the contact hole.

5. The semiconductor device according to claim 1, wherein when a dimension of the gate electrode along a channel length is $L_{gx}$, a dimension of the contact along the channel length is $L_{cx}$ and a fabrication precision in respect of positional deviation along the channel length between the gate electrode and the contact is $\Delta L_{cgx}$, $L_{cx} > L_{gx} + 2\Delta L_{cgx}$ is satisfied.

6. The semiconductor device according to claim 1, wherein when a dimension of the gate electrode along a channel length is $L_{gx}$, a dimension of the contact along the channel length is $L_{cx}$, a fabrication precision in respect of positional deviation along the channel length between the gate electrode and the contact is $\Delta L_{cgx}$, a fabrication precision in respect of the dimension of the gate electrode along the channel length is $\Delta L_{gx}$ and a fabrication precision in respect of the dimension of the contact along the channel length is $\Delta L_{cx}$, $L_{cx} > L_{gx} + \Delta L_{cx} + \Delta L_{gx} + 2\Delta L_{cgx}$ is satisfied.

7. The semiconductor device according to claim 1, wherein the contact comprises a silicide, one component of which is one of W, Ti, Co, Ni, Mo, Ta and Pt.

8. The semiconductor device according to claim 1, wherein a portion of the body region which forms a channel comprises at least one of Si, Ge and C.

9. The semiconductor device according to claim 1, wherein the gate insulator is formed of one of $SiO_2$, SiON, $Si_3N_4$, $ZrO_2$, $HfO_2$ and $Ta_2O_5$.

10. A semiconductor device comprising: a semiconductor substrate; a gate insulator formed over a predetermined region of the semiconductor substrate; a gate electrode formed on the gate insulator; source and drain regions respectively formed in portions of the predetermined region that are situated on both sides of the gate electrode in plan view; a body region formed by a region of the predetermined region exclusive of the source and drain regions; and a contact electrically interconnecting the gate electrode and the body region, wherein a portion of the contact which is connected to the gate electrode is formed to intersect the gate electrode in plan view, and wherein when a dimension of the gate electrode along a channel length is $L_{gx}$, a dimension of the contact along the channel length is $L_{cx}$ and a fabrication precision in respect of positional deviation along the channel length between the gate electrode and the contact is $\Delta L_{cgx}$, $L_{cx} > L_{gx} + 2\Delta L_{cgx}$ is satisfied.

11. A semiconductor device comprising: a semiconductor substrate; a gate insulator formed over a predetermined region of the semiconductor substrate; a gate electrode formed on the gate insulator; source and drain regions respectively formed in portions of the predetermined region that are situated on both sides of the gate electrode in plan view; a body region formed by a region of the predetermined region exclusive of the source and drain regions; and a contact electrically interconnecting the gate electrode and the body region, wherein a portion of the contact which is connected to the gate electrode is formed to intersect the gate electrode in plan view, and wherein when a dimension of the gate electrode along a channel length is $L_{gx}$, a dimension of the contact along the channel length is $L_{cx}$, a fabrication precision in respect of positional deviation along the channel length between the gate electrode and the contact is $\Delta L_{cgx}$, a fabrication precision in respect of the dimension of the gate electrode along the channel length is $\Delta L_{gx}$ and a fabrication precision in respect of the dimension of the contact along the channel length is $\Delta L_{cx}$, $L_{cx} > L_{gx} + \Delta L_{cx} + \Delta L_{gx} 2\Delta L_{cgx}$ is satisfied.

* * * * *